United States Patent
Yang et al.

(10) Patent No.: US 8,283,110 B2
(45) Date of Patent: Oct. 9, 2012

(54) METHOD FOR FABRICATING AN IMAGE SENSOR DEVICE

(75) Inventors: Ming-Sheng Yang, Hsinchu (TW); Ya-Yun Yu, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 218 days.

(21) Appl. No.: 12/816,743

(22) Filed: Jun. 16, 2010

(65) Prior Publication Data

US 2011/0311919 A1 Dec. 22, 2011

(51) Int. Cl.
*G03F 7/20* (2006.01)
(52) U.S. Cl. .................. 430/321; 430/330; 430/394
(58) Field of Classification Search .......... None
See application file for complete search history.

(56) References Cited

U.S. PATENT DOCUMENTS

| 6,995,911 B2 * | 2/2006 | Boettiger ............... 359/618 |
| 2007/0026564 A1 * | 2/2007 | Wu et al. ............... 438/69 |
| 2009/0261439 A1 * | 10/2009 | Liu et al. ............... 257/432 |

FOREIGN PATENT DOCUMENTS

JP 2006-196634 A * 7/2006

OTHER PUBLICATIONS

Computer-generated translation of JP 2006-196634 (Jul. 2006).*

* cited by examiner

*Primary Examiner* — John A McPherson
(74) *Attorney, Agent, or Firm* — Muncy, Geissler, Olds & Lowe, PLLC

(57) ABSTRACT

A method for fabricating an image sensor device is disclosed. The method for fabricating an image sensor device comprises forming a photosensitive layer on a substrate. The photosensitive layer is exposed through a first photomask to form an exposed portion and an unexposed portion. The unexposed portion is partially exposed through a second photomask to form a trimmed part, wherein the second photomask comprise a first segment and a second segment that has a transmittance greater than that of the first segment. The trimmed part is removed to form photosensitive structures. The photosensitive structures are reflowed to form a first microlens and a second microlens having different heights.

18 Claims, 10 Drawing Sheets

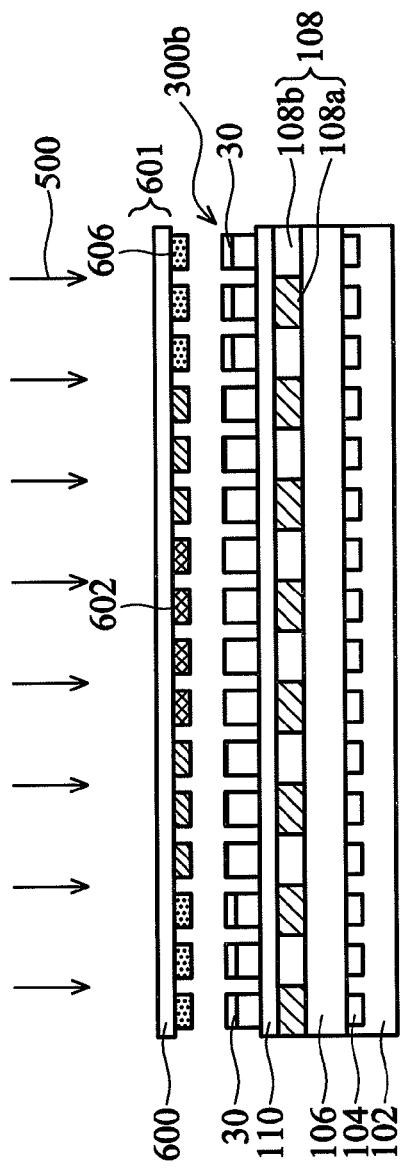
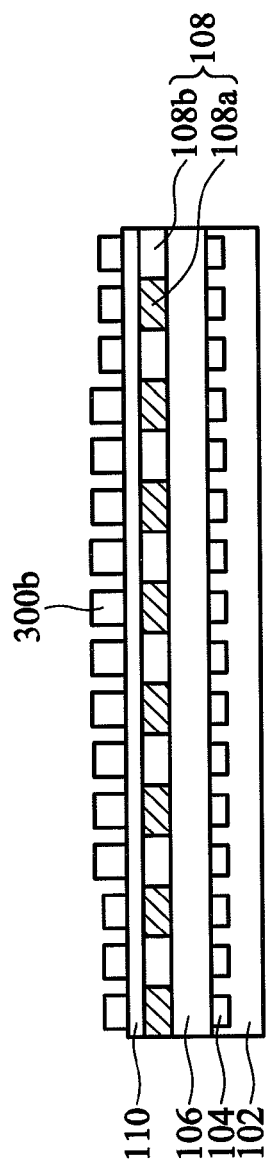

METHOD FOR FABRICATING AN IMAGE SENSOR DEVICE

BACKGROUND OF THE INVENTION

1. Field of the Invention

The present invention relates to methods for fabricating an image sensor device, and in particular relates to methods for fabricating an image sensor device having microlenses with different heights.

2. Description of the Related Art

As optoelectronic devices, such as digital cameras, digital video recorders, image capture capable mobile phones and monitors, become more and more popular, the demand for image sensor devices accordingly increase. An image sensor device is used for recording a change of a photo signal from an image and converting the photo signal into an electronic signal. After recording and processing the electronic signal, a digital image is generated. In general, image sensor devices can be categorized into two main types, one is charge coupled devices (CCD) and the other complementary metal oxide semiconductor (CMOS) devices.

An image sensor device typically comprises a pixel array. Each pixel includes a photosensor that produces a signal corresponding to the intensity of light impinging on the photosensor. When an image is focused on the array, signals can be employed to display a corresponding image. In conventional technology, a microlens array is correspondingly disposed above the pixel array and used for focusing light onto the pixel array. However, despite the use of the microlens array, a large amount of incident light is not directed efficiently onto the photosensors due to the geometry of the microlens array. The focal depth of the incident light to each photosensor is varied with the incident angle of the light (i.e. chief ray angle (CRA)). Accordingly, the microlens array with different focal depths reduces photosensitivity of the image sensor device.

Layered microlens structures for a microlens array have been proposed to address such a problem. However, the poor ability to control the microlens profile, wherein substantially the same microlens shape still reduces photosensitivity of the image sensor device. Therefore, there is a need to develop a method for fabricating an image sensor device, which is capable of easily controlling each individual microlens to have a desirable height, so that photosensitivity of the image sensor device is improved.

BRIEF SUMMARY OF THE INVENTION

A detailed description is given in the following embodiments with reference to the accompanying drawings. An embodiment of a method for fabricating an image sensor device comprises forming a photosensitive layer on a substrate. The photosensitive layer is exposed through a first photomask to form an exposed portion and an unexposed portion. The unexposed portion is partially exposed through a second photomask to form a trimmed part, wherein the second photomask comprise a first segment and a second segment that has a transmittance greater than that of the first segment. The trimmed part is removed to form photosensitive structures. The photosensitive structures are reflowed to form a first microlens and a second microlens having different heights.

BRIEF DESCRIPTION OF THE DRAWINGS

The present invention can be more fully understood by reading the subsequent detailed description and examples with references made to the accompanying drawings, wherein:

FIGS. 1a-1g show cross sections of an exemplary embodiment of a method for fabricating an image sensor device according to the invention;

FIGS. 5a and 5b show schematic top views of an exemplary embodiment of semi-transparent segments of the second photomask, in which the semi-transparent segments in FIG. 5b have relatively higher transmittances compared with the semi-transparent segments in FIG. 5a.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
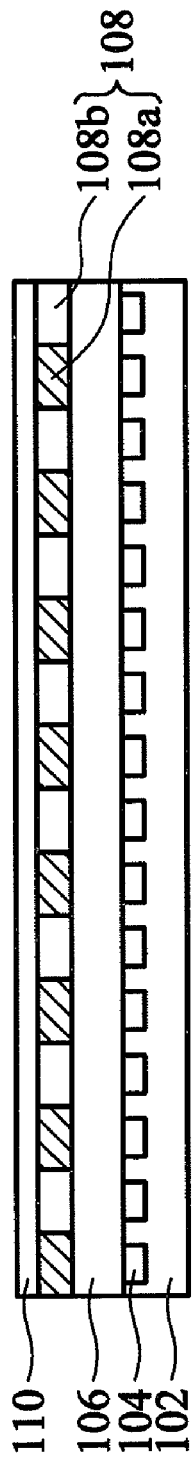

FIG. 1a shows a cross section of an exemplary embodiment of a substrate 102 with photosensors 104 such as photodiodes thereon. The substrate 102 may be a silicon substrate, silicon on insulator (SOI) substrate, a germanium substrate, a silicon germanium substrate or other semiconductor substrates. An intervening layer 106 including dielectric and metallic components (not shown) is formed over the substrate 102. A color filter array 108 including color filters 108a and 108b is formed over the intervening layer 106. The color filter array 108 may comprise a primary color system, i.e., comprising a red filter (R), a green filter (G), and a blue filter (B). Alternatively, the color filter array 108 may comprise a complementary color system comprising cyan, yellow, and magenta filters. A transparent substrate 110 such as glass or transparent resin is formed on the intervening layer 106.

Figure 1B:
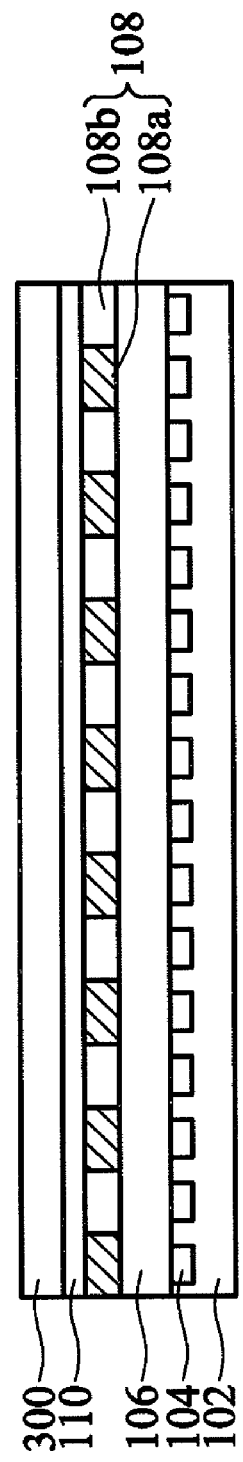

Referring to FIG. 1b, a photosensitive layer 300 suitable for a microlens array is coated on the transparent substrate 110 by a spin coating process. In one embodiment, the photosensitive layer 300 may comprise a positive photoresist which is removable after exposure to light and a development process. The photosensitive layer 300 may have a thickness of about 0.5 μm to about 3.0 μm and a substantially planar surface. The material of the photosensitive layer 300 may be a transparent polymeric material such as photosensitive polyimide.

Figure 1C:
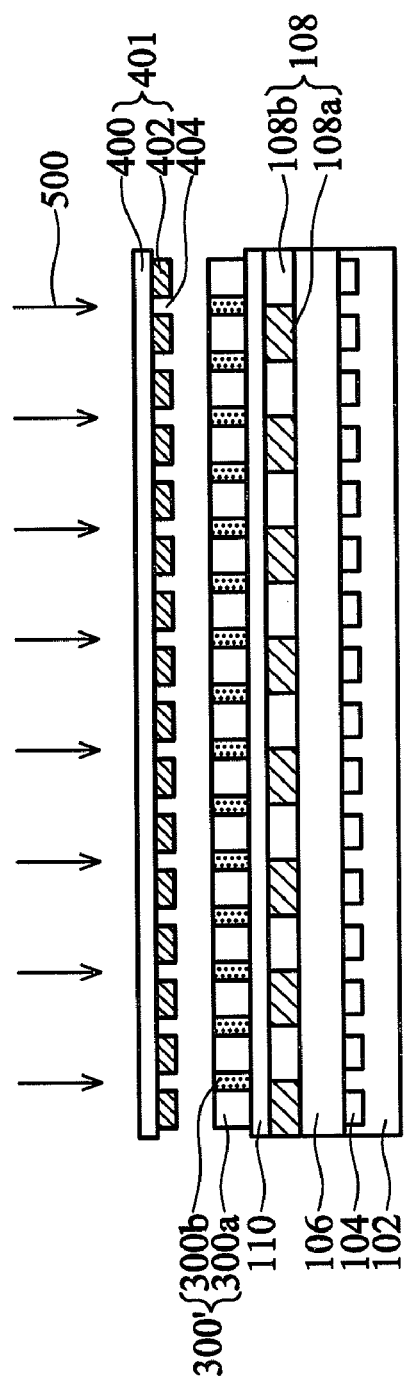
Figure 2:
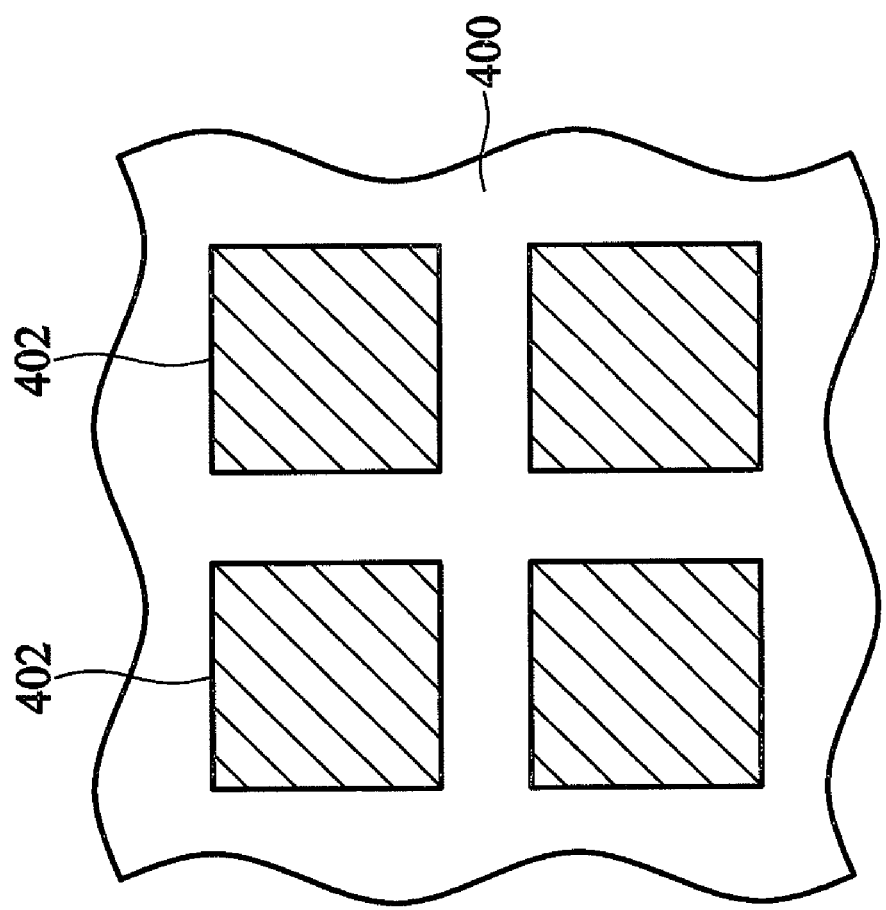
FIG. 2 shows a schematic top view of an exemplary embodiment of a first photomask with opaque segments according to the invention.
Figure 6:
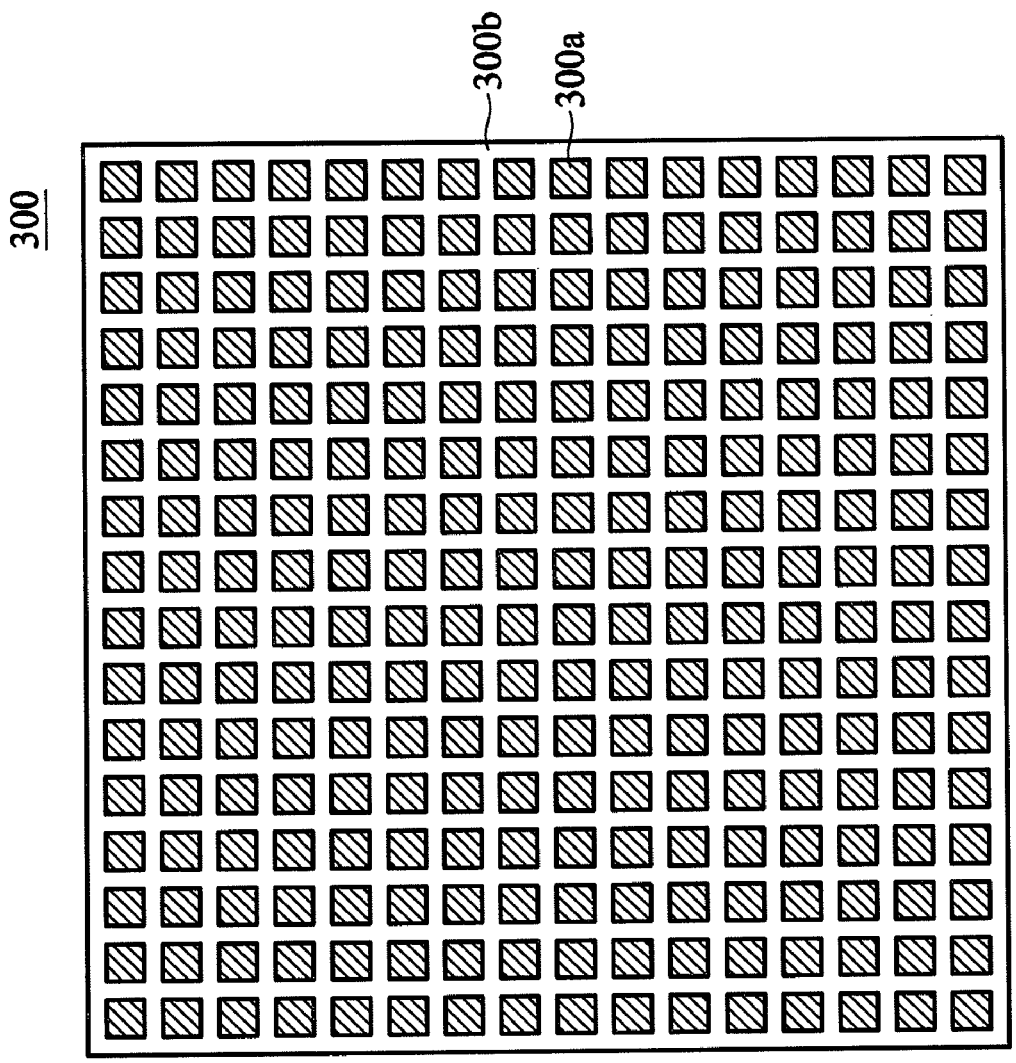
FIG. 6 shows a top view of an exemplary embodiment of the photosensitive layer after exposure of light through the first photomask.

As shown in FIG. 1c and FIG. 6, a photolithographic process is performed so that the photosensitive layer 300 is exposed to light 500 through a first photomask 401 to form a photosensitive layer 300' including an exposed portion 300b and an unexposed portion 300a. The first photomask 401 includes a transparent blank (glass) 400 and a plurality of opaque segments 402 spaced apart from each other to define a light shielding region and a transmissive region 404 not covered by the opaque segments 402. FIG. 2 shows a top view of the first photomask 401 with four opaque segments 402 on the transparent blank 400. The pattern of each of the opaque segments 402 is projected to an area in which each microlens is to be formed as the exposure process is preformed. Therefore, the pattern of the unexposed portion 300a of the photosensitive layer 300' is transferred from the opaque segments 402.

Figure 1D:
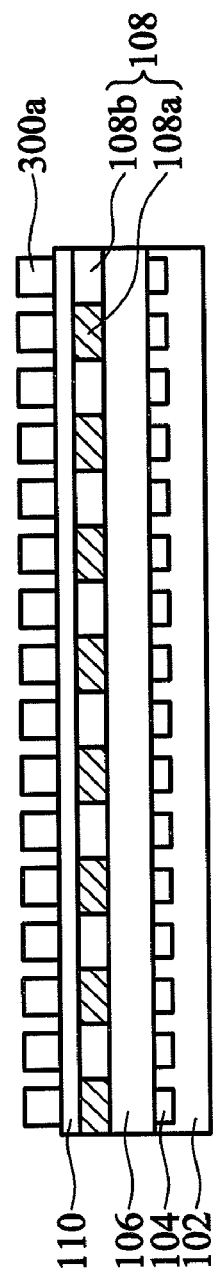

Referring to FIG. 1d, the photosensitive layer 300' is optionally developed by a developing solution to remove the exposed portion 300b and leave the unexposed portion 300a which is also referred to as photosensitive structures. The development process is also referred to as the first time development. The developing solution may be a buffered aqueous alkaline solution.

Referring to FIG. 1e, the unexposed portion 300a (photosensitive structures) is locally and partially exposed to light through a second photomask 601 to form a trimmed part 30 on the top of the photosensitive structures.

Figure 3B:
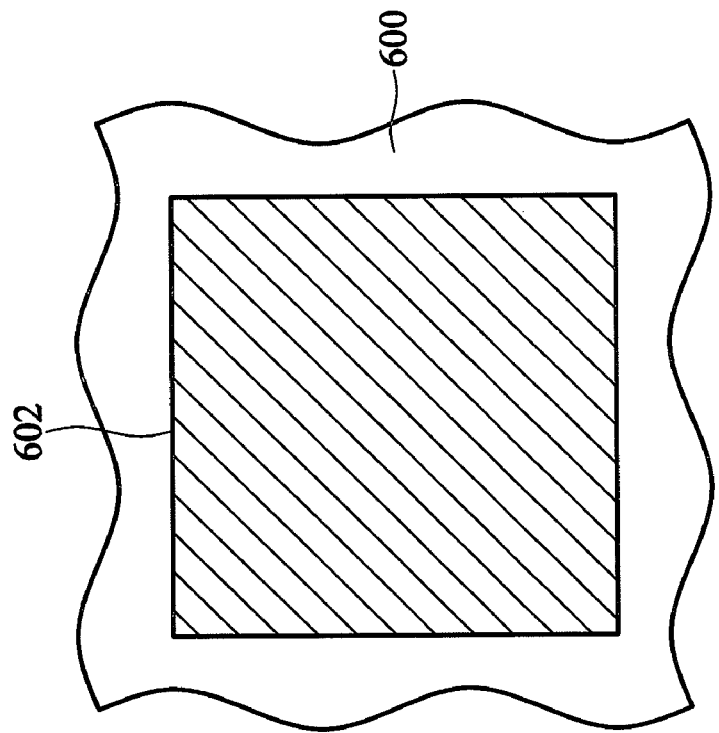
FIG. 3b shows a schematic top view of another exemplary embodiment of the opaque segments of a second photomask according to the invention.
Figure 3A:
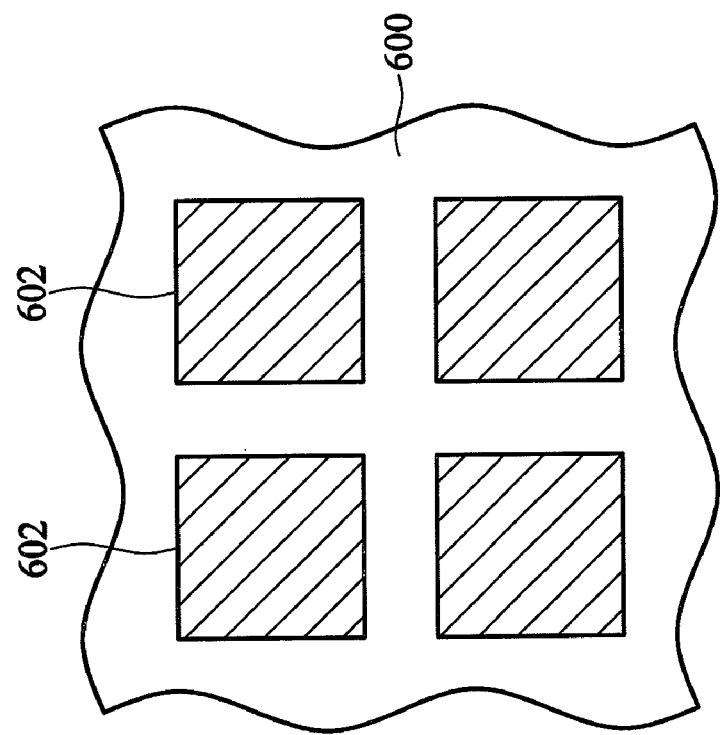
FIG. 3a shows a schematic top view of an exemplary embodiment of the opaque segments of a second photomask according to the invention.

The second photomask 601 may includes at least one first segment 602 and at least one second segment 606 having a transmittance greater than that of the first segment 602 on a transparent blank 600. In one embodiment, the first segment 602 is opaque and comprises a light-shielding metal such as Cr. FIG. 3a shows an exemplary embodiment of four first segments 602 of the second photomask 601 according to the invention. Each of the first segments 602, as shown in FIG. 3a, corresponds to a position in which one microlens is to be formed. FIG. 3b shows another exemplary embodiment of one first segment 602 of the second photomask 601 according to the invention. The first segments 602 may comprise an opaque material and protect a desired portion of the unexposed portion 300a from light exposure. The first segment 602 in FIG. 3b protects an area in which a plurality of microlenses is to be formed.

Figure 4B:
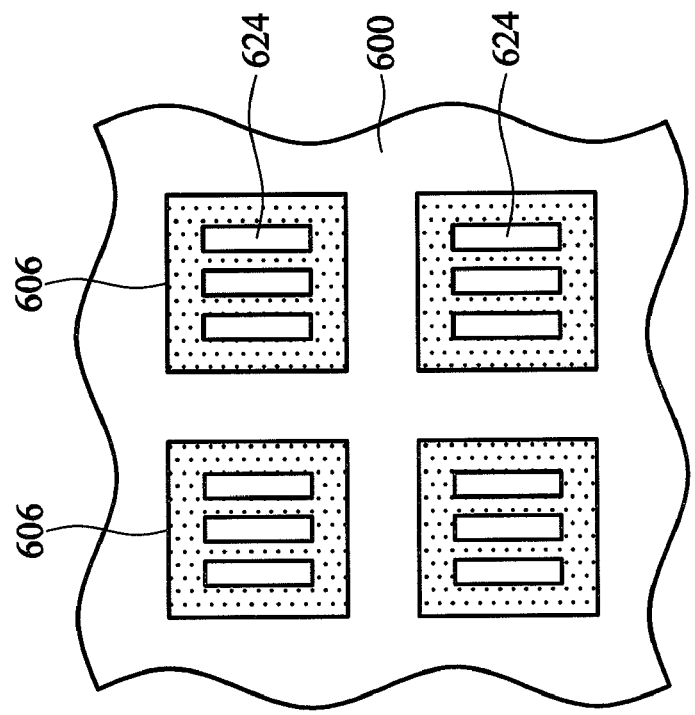
FIG. 4b shows a schematic top view of another exemplary embodiment of the semi-transparent segments of the second photomask according to the invention.
Figure 4A:
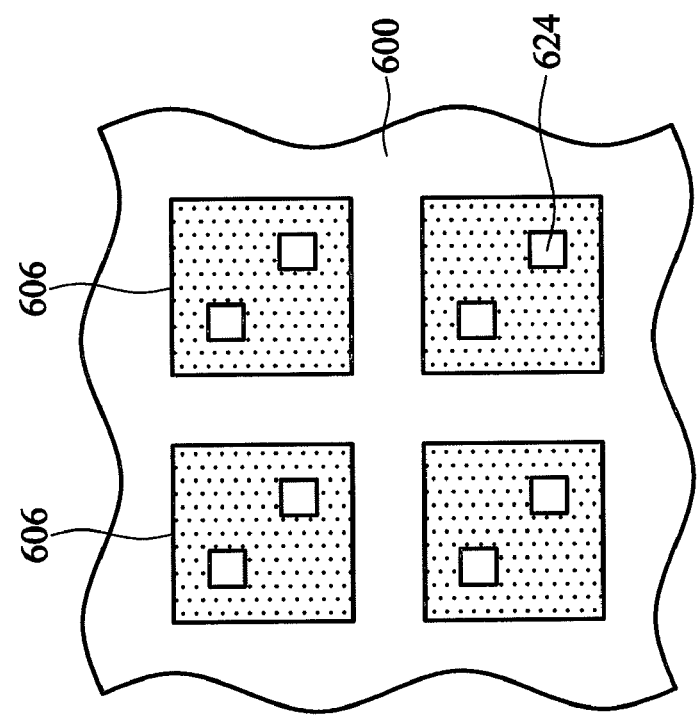
FIG. 4a shows a schematic top view of an exemplary embodiment of the semi-transparent segments of the second photomask according to the invention.
Figure 4C:
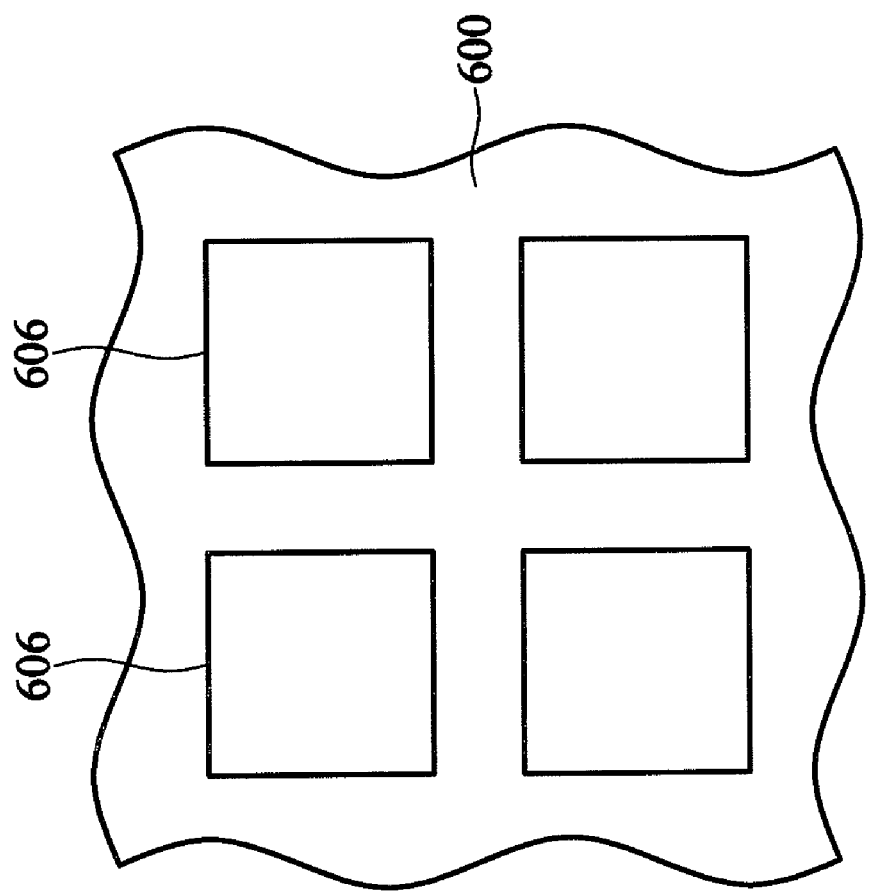
FIG. 4c shows a schematic top view of yet another exemplary embodiment of the semi-transparent segments of the second photomask according to the invention.

It is noted that the second segment 606 may comprise an opaque layer with openings 624 which is pervious to light and form a semi-transparent segment. FIG. 4a shows a top view of four second segments 606 of the second photomask 601. In FIG. 4a, each of the second segments 606 has square openings 624 and corresponds to a position in which one microlens with a reduced height is to be formed. The shape of the openings 624 may be a striped shape as shown in FIG. 4b. Alternatively, the shape of the openings 624 may be circular, or oval shaped, or polygonal shaped such as a triangular, square, rectangular, or pentagonal shape, or striped shaped or combinations thereof. The transmittance of the second segment 606 can be determined by adjusting the number or diameter of the openings 624. The larger the total area of the openings 624, the higher the transmittance of the second segment 606. In some embodiments, the second segment 606 can comprise suitable semi-transparent materials without any openings. For example, the semi-transparent material can be MoSi, MoSiN, ToSi$_2$, Mo, Nb$_2$O$_5$, Ti, Ta, CrN, MoO$_3$, MoN, Cr$_2$O$_3$, TiN, ZrN, TiO$_2$, TaN, Ta$_2$O$_5$, SiO$_2$, NbN, Si$_3$N$_4$, ZrN, or Al$_2$O$_3$N or combinations thereof. The transmittance of the second segment 606 can be determined by selecting suitable materials or adjusting the thickness of the semi-transparent material. Note that the thicker the semi-transparent material is, the higher the transmittance of the second segment 606 is.

Then, as shown in FIG. 1e and FIG. 1f, the second photomask 601 is removed and the photosensitive structures with the trimmed parts 30 are developed by a developing solution to dissolve and remove the trimmed parts 30 and leave at least one cavity (not shown) at each photosensitive structure. Alternatively, the exposed portion 300b as shown in FIG. 1c and the trimmed part 30 can be simultaneously removed if the first time development is skipped (not performed). In one embodiment, the trimmed parts 30 of the photosensitive structures can be formed in the edge region of the image sensor device so as to form a modified microlens with a reduced height during subsequent processes while the photosensitive structures in the center region of the image sensor device are being protected by the first pattern 602 and not being trimmed during the photolithography process.

Figure 1G:
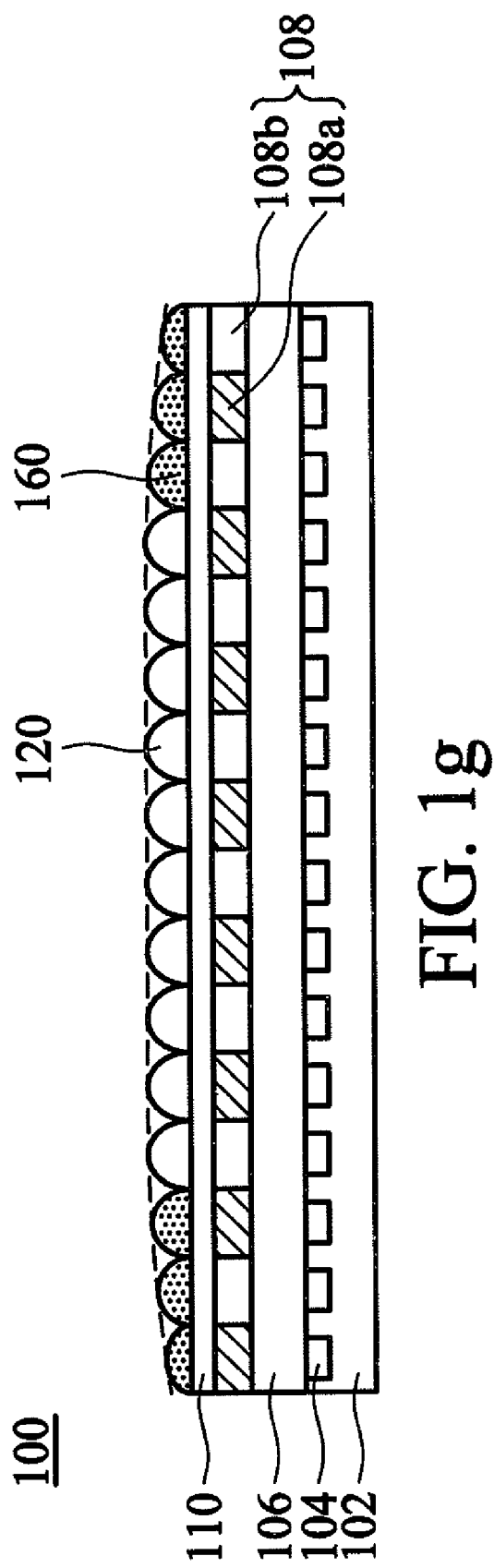

Next, a thermal process is performed to reflow the photosensitive structures formed over the transparent substrate 110 at about 150° C. to about 250, thereby forming the image sensor device 100 illustrated in FIG. 1g which has a microlens 120 and a microlens 160 with reduced height as compared with the microlens 120. The microlens 120 and microlens 160 each has a diameter greater than 1.5 μm, preferably between about 2 μm and about 6 μm. Also, the microlens 120 or microlens 160 may have a height greater than 0.5 μm, preferably between about 0.7 μm and about 2.0 μm. The image sensor device manufactured by the exemplary method is capable of providing a planar focal plane to reduce light field curvature caused by focal length differences of the microlenses.

Figure 5B:
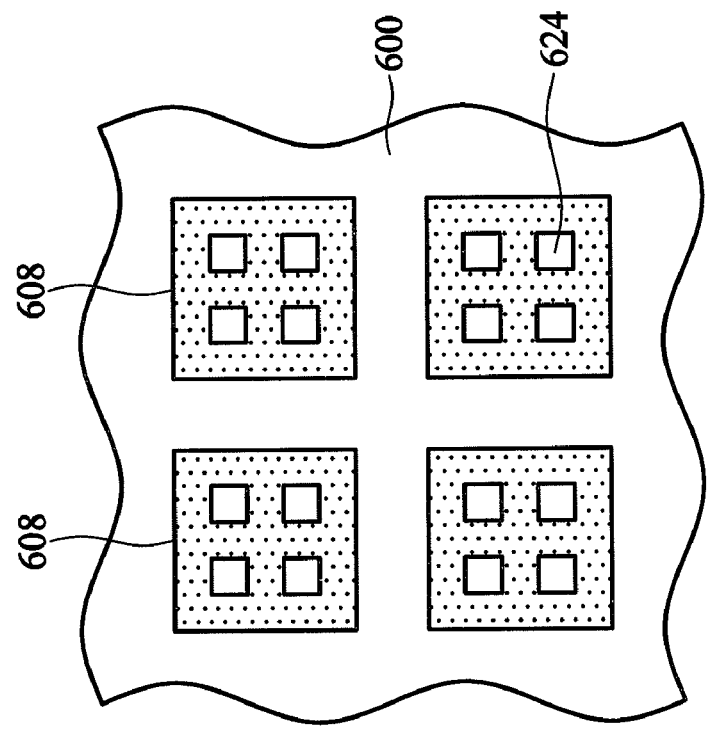
Figure 5A:
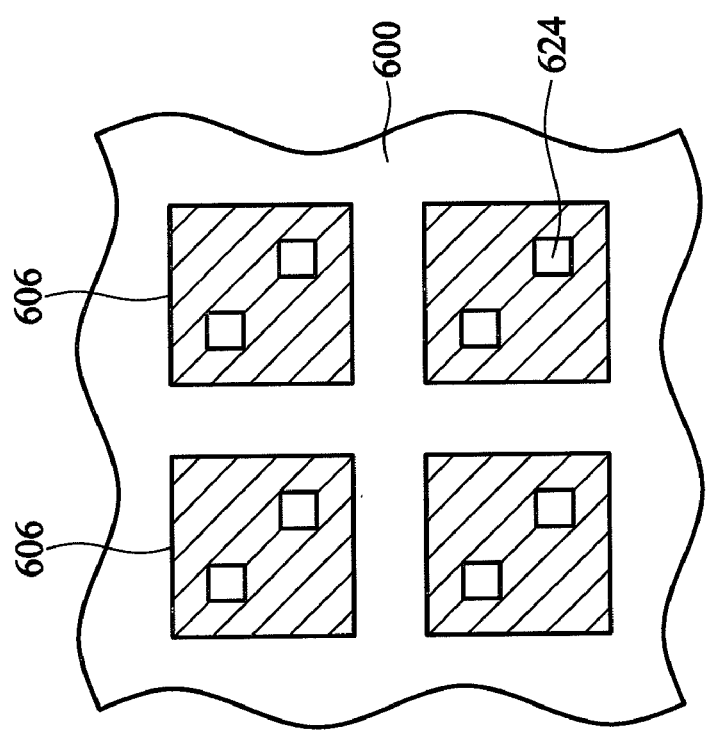

In some embodiments, the second photomask 601 may further comprise at least one third segment 608 having a transmittance greater than that of the second segment 606 as shown in FIG. 5a and FIG. 5b. The third segment 608 may comprise an opaque layer such as Chromium with a relatively large number of openings 624 as compared with the second segment 606. The openings 624 of the third segment 608 may be circular, or oval shaped, or polygonal shaped such as a triangular, square, rectangular, or pentagonal shape, or striped shaped or combinations thereof. Alternatively, the third segment 608 may comprise a semi-transparent material with a transmittance greater than that of the second segment 606. In another exemplary embodiment, the method for fabricating an image sensor device described in FIG. 1a to FIG. 1g is performed except that the second photomask 601 includes at least one first segment 602, at least one second segment 606 and at least one third segment 608 formed on a transparent blank 600. The transmittance of the second segment 606 is greater than that of the first segment 602, and the transmittance of the third segments 608 is greater than that of the second segment 606.

According to the exemplary method for fabricating an image sensor device described above, the image sensor device may have microlenses with at least three heights, in which the lowest microlens is obtained by reflowing the photosensitive structure that has been exposed to light through the third segment of the second photomask and developed by a developing solution. The exemplary method for fabricating the image sensor device described above is beneficial for relatively large microlenses which have a diameter greater than about 1.5 μm. Each individual microlens of the image sensor device with different heights is more feasibly fabricated, because the relatively large opening of the second segment can be easily controlled.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an image sensor device, comprising:
    forming a photosensitive layer on a substrate;
    exposing the photosensitive layer through a first photomask to form an exposed portion and an unexposed portion;
    partially exposing the unexposed portion through a second photomask to form a trimmed part, wherein the second photomask comprise a first segment and a second segment that has a transmittance greater than that of the first segment, wherein the first segment is opaque and the second segment is semi-transparent;
    removing the trimmed part to form photosensitive structures; and
    reflowing the photosensitive structures to form a first microlens and a second microlens having different heights.

2. The method for fabricating an image sensor device as claimed in claim 1, further comprising removing the exposed portion before partially exposing the unexposed portion.

3. The method for fabricating an image sensor device as claimed in claim 1, wherein the exposed portion and the trimmed part are simultaneously removed.

4. The method for fabricating an image sensor device as claimed in claim 1, wherein the second segment comprises an opaque layer with openings pervious to light.

5. The method for fabricating an image sensor device as claimed in claim 4, wherein the openings are circular, rectangular, triangular, square, or stripe shaped, or combinations thereof.

6. The method for fabricating an image sensor device as claimed in claim 4, wherein the opaque layer comprises Cr.

7. The method for fabricating an image sensor device as claimed in claim 1, wherein the second segment comprises MoSi, MoSiN, ToSi$_2$, Mo, Nb$_2$O$_5$, Ti, Ta, CrN, MoO$_3$, MoN, Cr$_2$O$_3$, TiN, ZrN, TiO$_2$, TaN, Ta$_2$O$_5$, SiO$_2$, NbN, Si$_3$N$_4$, ZrN, or Al$_2$O$_3$N or combinations thereof.

8. The method for fabricating an image sensor device as claimed in claim 1, wherein the first microlens and the second microlens each has a diameter between about 2 μm and about 6 μm.

9. The method for fabricating an image sensor device as claimed in claim 1, wherein the first microlens or the second microlens has a height greater than about 0.7 μm to about 2.0 μm.

10. The method for fabricating an image sensor device as claimed in claim 1, wherein the photosensitive layer is a positive photoresist layer.

11. The method for fabricating an image sensor device as claimed in claim 1, wherein the photosensitive structures have at least one cavity after the trimmed part is removed.

12. The method for fabricating an image sensor device as claimed in claim 1, wherein the unexposed portion is partially exposed through the second segment.

13. The method for fabricating an image sensor device as claimed in claim 1, wherein the second photomask further comprises a third segment having a transmittance greater than that of the second segment.

14. The method for fabricating an image sensor device as claimed in claim 13, wherein the third segment comprises an opaque layer with openings pervious to light.

15. The method for fabricating an image sensor device as claimed in claim 14, wherein the openings are circular, rectangular, triangular, square, or stripe shaped, or combinations thereof.

16. The method for fabricating an image sensor device as claimed in claim 14, wherein the opaque layer comprises Cr.

17. The method for fabricating an image sensor device as claimed in claim 14, wherein the third segment comprises MoSi, MoSiN, ToSi$_2$, Mo, Nb$_2$O$_5$, Ti, Ta, CrN, MoO$_3$, MoN, Cr$_2$O$_3$, TiN, ZrN, TiO$_2$, TaN, Ta$_2$O$_5$, SiO$_2$, NbN, Si$_3$N$_4$, ZrN, Al$_2$O$_3$N or combinations thereof.

18. The method for fabricating an image sensor device as claimed in claim 1, wherein the photosensitive structures are reflowed by a thermal process at about 150° C. to about 250° C.

* * * * *